United States Patent
Filiz et al.

(10) Patent No.: US 9,983,715 B2
(45) Date of Patent: May 29, 2018

(54) FORCE DETECTION IN TOUCH DEVICES USING PIEZOELECTRIC SENSORS

(71) Applicant: Apple Inc., Cupertino, CA (US)

(72) Inventors: Sinan Filiz, Cupertino, CA (US); Brian Q. Huppi, Cupertino, CA (US); Kai Wang, Waterloo (CA); Peter W. Richards, San Francisco, CA (US); Vikram Garg, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days. days.

(21) Appl. No.: 14/651,216

(22) PCT Filed: Mar. 15, 2013

(86) PCT No.: PCT/US2013/032607
§ 371 (c)(1),
(2) Date: Jun. 10, 2015

(87) PCT Pub. No.: WO2014/098946
PCT Pub. Date: Jun. 26, 2014

(65) Prior Publication Data
US 2015/0331517 A1 Nov. 19, 2015

Related U.S. Application Data

(60) Provisional application No. 61/738,381, filed on Dec. 17, 2012.

(51) Int. Cl.
*G06F 3/041* (2006.01)
*G06F 3/044* (2006.01)
(Continued)

(52) U.S. Cl.
CPC .......... *G06F 3/0414* (2013.01); *G06F 1/1652* (2013.01); *G06F 3/041* (2013.01);
(Continued)

(58) Field of Classification Search
CPC ...... G06F 3/016; G06F 3/0488; G06F 3/0416; G06F 3/0412; G06F 3/0414; G06F 3/044;
(Continued)

(56) References Cited

U.S. PATENT DOCUMENTS 3,876,912 A 4/1975 Sanders
4,345,477 A 8/1982 Johnson
(Continued)

FOREIGN PATENT DOCUMENTS

CN 1527933 A 9/2004
CN 1796955 7/2006
(Continued)

OTHER PUBLICATIONS

Bau, et al., "TeslaTouch: Electrovibration for Touch Surfaces," UIST'10, Oct. 3-6, 2010, New York, New York USA, 10 pages.
(Continued)

*Primary Examiner* — Dismery Mercedes
(74) *Attorney, Agent, or Firm* — Brownstein Hyatt Farber Schreck, LLP

(57) ABSTRACT

Systems and methods related to piezoelectric based force sensing in touch devices are presented. One embodiment, for example, may take the form of an apparatus including a touch device having a deformable device stack and a piezoelectric element positioned relative to the deformable device stack such that the piezoelectric element deforms with the deformable stack. Deformation of the piezoelectric element generates a signal having a magnitude discernable as representative of an amount of force applied to the touch device.

23 Claims, 12 Drawing Sheets

(51) Int. Cl.
  *G06F 1/16* (2006.01)
  *G01L 1/16* (2006.01)
  *H01L 41/277* (2013.01)
  *H01L 27/32* (2006.01)

(52) U.S. Cl.
  CPC ............ *G06F 3/044* (2013.01); *H01L 27/323* (2013.01); *H01L 41/277* (2013.01); *G06F 2203/04102* (2013.01); *G06F 2203/04106* (2013.01)

(58) Field of Classification Search
  CPC ......... G06F 3/041; G06F 1/1652; G01L 1/16; G01L 1/205; G01L 1/146; G01L 23/10; G01L 9/008; H01L 41/22; H01L 41/257; H01L 41/277; H01L 41/083; H01L 41/193; H01L 41/293; H01L 41/1132; H01L 27/323; H01L 27/3244; H01L 2251/5338; H01L 51/0097
  See application file for complete search history.

(56) References Cited

U.S. PATENT DOCUMENTS

| | | | |
|---|---|---|---|
| 4,423,640 A | 1/1984 | Jetter | |
| 4,516,112 A | 5/1985 | Chen | |
| 4,634,917 A * | 1/1987 | Dvorsky | G01B 7/004 310/323.21 |
| 4,695,963 A | 9/1987 | Sagisawa | |
| 4,951,510 A | 8/1990 | Holm-Kennedy et al. | |
| 5,481,905 A | 1/1996 | Pratt | |
| 5,577,021 A | 11/1996 | Nakatani et al. | |
| 5,616,846 A | 4/1997 | Kwasnik | |
| 5,673,041 A | 9/1997 | Chatigny et al. | |
| 5,708,460 A | 1/1998 | Young | |
| 5,790,215 A | 8/1998 | Sugahara | |
| 5,915,285 A | 6/1999 | Sommer | |
| 6,288,829 B1 | 9/2001 | Kimura | |
| 6,369,865 B2 | 4/2002 | Hinata | |
| 6,637,276 B2 | 10/2003 | Adderton et al. | |
| 6,812,161 B2 | 11/2004 | Heremans | |
| 7,176,897 B2 | 2/2007 | Roberts | |
| 7,190,350 B2 | 3/2007 | Roberts | |
| 7,196,694 B2 | 3/2007 | Roberts | |
| 7,211,885 B2 | 5/2007 | Nordal et al. | |
| 7,320,253 B2 | 1/2008 | Hanazawa et al. | |
| 7,392,716 B2 | 7/2008 | Wilner | |
| 7,441,467 B2 | 10/2008 | Bloom | |
| 7,511,702 B2 | 3/2009 | Hotelling | |
| 7,724,248 B2 | 5/2010 | Saito | |
| 7,755,616 B2 | 7/2010 | Jung et al. | |
| 7,800,592 B2 | 9/2010 | Kerr et al. | |
| 8,020,456 B2 | 9/2011 | Liu et al. | |
| 8,050,876 B2 | 11/2011 | Feen et al. | |
| 8,132,468 B2 | 3/2012 | Radivojevic | |
| 8,243,225 B2 | 8/2012 | Kai et al. | |
| 8,266,971 B1 | 9/2012 | Jones | |
| 8,289,286 B2 | 10/2012 | Stallings et al. | |
| 8,305,358 B2 | 11/2012 | Klighult et al. | |
| 8,421,483 B2 * | 4/2013 | Klinghult | G06F 3/044 324/658 |
| 8,434,369 B2 | 5/2013 | Hou et al. | |
| 8,456,430 B2 | 6/2013 | Oliver et al. | |
| 8,648,816 B2 | 2/2014 | Homma et al. | |
| 8,669,952 B2 | 3/2014 | Hashimura et al. | |
| 8,669,962 B2 | 3/2014 | Kuan | |
| 8,692,646 B2 | 4/2014 | Lee et al. | |
| 8,711,128 B2 | 4/2014 | Small et al. | |
| 8,780,074 B2 * | 7/2014 | Castillo | G06F 3/044 345/174 |
| 8,780,543 B2 | 7/2014 | Molne et al. | |
| 8,870,087 B2 | 10/2014 | Coogan et al. | |
| 8,988,384 B2 * | 3/2015 | Krah | G06F 3/0414 178/18.05 |
| 9,024,910 B2 | 5/2015 | Stephanou et al. | |
| 9,030,427 B2 | 5/2015 | Yasumatsu | |
| 9,063,599 B2 | 6/2015 | Yanagi et al. | |
| 9,081,460 B2 | 7/2015 | Jeong et al. | |
| 9,099,971 B2 | 8/2015 | Lynn et al. | |
| 9,110,532 B2 | 8/2015 | Ando et al. | |
| 9,116,569 B2 | 8/2015 | Stacy et al. | |
| 9,116,570 B2 | 8/2015 | Lee et al. | |
| 9,182,849 B2 | 11/2015 | Huang et al. | |
| 9,182,859 B2 * | 11/2015 | Coulson | G06F 3/044 |
| 9,223,162 B2 | 12/2015 | DeForest et al. | |
| 9,246,486 B2 | 1/2016 | Yang et al. | |
| 9,262,002 B2 * | 2/2016 | Momeyer | G06F 3/0414 |
| 9,262,003 B2 * | 2/2016 | Kitchens | G06F 3/0414 |
| 9,292,115 B2 * | 3/2016 | Kauhanen | G06F 3/041 |
| 9,304,348 B2 | 4/2016 | Jang | |
| 9,329,729 B2 | 5/2016 | Kim et al. | |
| 9,417,725 B1 | 8/2016 | Watazu et al. | |
| 9,454,268 B2 | 9/2016 | Badaye et al. | |
| 9,466,783 B2 | 10/2016 | Olien et al. | |
| 9,501,167 B2 * | 11/2016 | Day | G06F 3/0414 |
| 9,507,456 B2 | 11/2016 | Watazu et al. | |
| 9,542,028 B2 | 1/2017 | Filiz et al. | |
| 9,612,170 B2 | 4/2017 | Vosgueritchian et al. | |
| 9,658,722 B2 | 5/2017 | Schwartz | |
| 9,665,200 B2 | 5/2017 | Filiz et al. | |
| 9,690,413 B2 * | 6/2017 | Filiz | G06F 3/0414 |
| 9,690,414 B2 | 6/2017 | Kano et al. | |
| 9,729,730 B2 | 8/2017 | Levesque et al. | |
| 2002/0149571 A1 | 10/2002 | Roberts | |
| 2003/0234769 A1* | 12/2003 | Cross | G06F 3/0412 345/173 |
| 2006/0197753 A1 | 9/2006 | Hotelling | |
| 2008/0165159 A1 | 7/2008 | Soss et al. | |
| 2008/0218488 A1 | 9/2008 | Yang et al. | |
| 2009/0002199 A1* | 1/2009 | Lainonen | H03K 17/964 341/20 |
| 2009/0046072 A1* | 2/2009 | Emig | G06F 3/044 345/173 |
| 2009/0189866 A1 | 7/2009 | Haffenden et al. | |
| 2009/0267902 A1* | 10/2009 | Nambu | G06F 3/016 345/173 |
| 2009/0309616 A1* | 12/2009 | Klinghult | G06F 3/044 324/686 |
| 2009/0316380 A1 | 12/2009 | Armstrong | |
| 2010/0053116 A1 | 3/2010 | Daverman et al. | |
| 2010/0103115 A1 | 4/2010 | Hainzl | |
| 2010/0117809 A1* | 5/2010 | Dai | G06F 3/016 340/407.2 |
| 2010/0128002 A1* | 5/2010 | Stacy | G06F 3/016 345/174 |
| 2011/0045285 A1 | 2/2011 | Saiki et al. | |
| 2011/0128250 A1* | 6/2011 | Murphy | G06F 3/016 345/174 |
| 2011/0175844 A1* | 7/2011 | Berggren | G06F 3/0414 345/174 |
| 2011/0248839 A1 | 10/2011 | Kwok et al. | |
| 2011/0261021 A1* | 10/2011 | Modarres | G06F 3/016 345/177 |
| 2011/0278078 A1* | 11/2011 | Schediwy | G01L 1/146 178/18.06 |
| 2011/0285660 A1* | 11/2011 | Prabhu | G06F 1/1643 345/174 |
| 2012/0038577 A1 | 2/2012 | Brown et al. | |
| 2012/0105333 A1* | 5/2012 | Maschmeyer | G06F 3/016 345/173 |
| 2012/0105367 A1 | 5/2012 | Son et al. | |
| 2012/0111119 A1* | 5/2012 | Small | G06F 3/0436 73/633 |
| 2012/0127136 A1* | 5/2012 | Schneider | G02F 1/13718 345/204 |
| 2012/0154299 A1 | 6/2012 | Hsu et al. | |
| 2012/0139864 A1 | 7/2012 | Sleeman et al. | |
| 2012/0188198 A1 | 7/2012 | Jeong et al. | |
| 2012/0194483 A1* | 8/2012 | Deluca | G06F 1/1643 345/177 |
| 2012/0268416 A1* | 10/2012 | Pirogov | G06F 3/0416 345/174 |

(56) References Cited

U.S. PATENT DOCUMENTS

| | | | |
|---|---|---|---|
| 2012/0293491 A1 | 11/2012 | Wang et al. | |
| 2013/0050126 A1* | 2/2013 | Kimura | G02F 1/13338 345/173 |
| 2013/0074988 A1 | 3/2013 | Chou | |
| 2013/0082970 A1* | 4/2013 | Frey | G06F 3/0414 345/173 |
| 2013/0141365 A1 | 6/2013 | Lynn et al. | |
| 2013/0147739 A1 | 6/2013 | Aberg et al. | |
| 2013/0154933 A1 | 6/2013 | Sheik-Nainar | |
| 2013/0155059 A1 | 6/2013 | Wang et al. | |
| 2013/0215056 A1 | 8/2013 | Johansson et al. | |
| 2013/0257759 A1* | 10/2013 | Daghigh | G06F 3/0412 345/173 |
| 2013/0328803 A1 | 12/2013 | Fukushima et al. | |
| 2013/0333922 A1 | 12/2013 | Kai et al. | |
| 2014/0062934 A1* | 3/2014 | Coulson | G06F 3/044 345/174 |
| 2014/0118635 A1 | 5/2014 | Yang | |
| 2014/0174190 A1 | 6/2014 | Kulkarni et al. | |
| 2014/0191973 A1 | 7/2014 | Zellers et al. | |
| 2014/0347315 A1 | 11/2014 | Mo et al. | |
| 2015/0002452 A1 | 1/2015 | Klinghult | |
| 2015/0101849 A1 | 4/2015 | Bockmeyer et al. | |
| 2015/0116260 A1 | 4/2015 | Hoen et al. | |
| 2015/0169100 A1 | 6/2015 | Tsuyuki et al. | |
| 2015/0268725 A1 | 9/2015 | Levesque et al. | |
| 2015/0301684 A1 | 10/2015 | Shimamura | |
| 2016/0033389 A1 | 2/2016 | Serpe | |
| 2016/0034073 A1 | 2/2016 | Andoh | |
| 2016/0035290 A1 | 2/2016 | Kim et al. | |
| 2016/0041672 A1 | 2/2016 | Hoen et al. | |
| 2016/0048266 A1 | 2/2016 | Smith et al. | |
| 2016/0062517 A1 | 3/2016 | Meyer et al. | |
| 2016/0117035 A1 | 4/2016 | Watazu et al. | |
| 2016/0132151 A1 | 5/2016 | Watazu et al. | |
| 2016/0147353 A1 | 5/2016 | Filiz et al. | |
| 2016/0306481 A1 | 10/2016 | Filiz et al. | |
| 2016/0357297 A1 | 12/2016 | Picciotto et al. | |
| 2017/0031495 A1 | 2/2017 | Smith | |
| 2017/0075465 A1 | 3/2017 | Pedder et al. | |
| 2017/0090638 A1 | 3/2017 | Vosgueritchian et al. | |
| 2017/0090655 A1 | 3/2017 | Zhang et al. | |
| 2017/0191884 A1 | 7/2017 | Vosgueritchian et al. | |
| 2017/0261387 A1 | 9/2017 | Vosgueritchian et al. | |
| 2017/0269757 A1 | 9/2017 | Filiz et al. | |
| 2017/0285799 A1 | 10/2017 | Iuchi et al. | |
| 2017/0285864 A1 | 10/2017 | Pedder et al. | |
| 2018/0067612 A1 | 3/2018 | Smith | |

FOREIGN PATENT DOCUMENTS

| | | |
|---|---|---|
| CN | 1860432 | 11/2006 |
| CN | 101017419 | 8/2007 |
| CN | 101071354 | 11/2007 |
| CN | 101201277 A | 6/2008 |
| CN | 101950224 | 1/2011 |
| CN | 102012772 | 4/2011 |
| CN | 102047088 | 5/2011 |
| CN | 102165400 | 8/2011 |
| CN | 102175362 A | 9/2011 |
| CN | 102460351 | 5/2012 |
| CN | 102591519 | 7/2012 |
| CN | 102822779 | 12/2012 |
| CN | 103026327 | 4/2013 |
| CN | 103069365 | 4/2013 |
| CN | 103197821 | 7/2013 |
| CN | 103336562 | 10/2013 |
| CN | 103582807 | 2/2014 |
| CN | 204461655 U | 7/2015 |
| CN | 104866134 | 8/2015 |
| CN | 204576454 U | 8/2015 |
| CN | 105444662 | 3/2016 |
| EP | 0332365 | 9/1989 |
| EP | 0467562 | 1/1992 |
| EP | 1840714 | 10/2007 |
| EP | 2120136 | 11/2009 |
| EP | 2381340 | 10/2011 |
| EP | 2629075 | 8/2013 |
| FR | 2907563 | 4/2008 |
| JP | 201039458 A | 2/2010 |
| JP | 2010039458 | 2/2010 |
| JP | 2010197066 | 9/2010 |
| WO | WO 96/038833 | 12/1996 |
| WO | WO 02/035461 | 5/2002 |
| WO | WO 07/074800 | 7/2007 |
| WO | WO 11/156447 | 12/2011 |
| WO | WO 12/168892 | 12/2012 |
| WO | WO 13/177322 | 11/2013 |
| WO | WO 15/106183 | 7/2015 |
| WO | WO 15/158952 | 10/2015 |
| WO | WO 16/029354 | 3/2016 |

OTHER PUBLICATIONS

Feist, "Samsung snags patent for new pressure sensitive touch-screens," posted on AndroidAuthority.com at URL: http://www.androidauthority.com/samsung-patent-pressure-sensitive-touch-screens-354860, Mar. 7, 2014, 1 page.

Rausch, "Printed piezoresistive strain sensors for monitoring of light-weight structures," SENSOR+TEST Conferences 2011—SENSOR Proceedings, pp. 216-220.

Schweizer, "Electrical characterization and investigation of the piezoresistive effect of PEDOT:PSS thin films," A Thesis Presented to the Academic Faculty in Partial Fulfillment of the Requirements for the Degree Master of Science of Electrical and Computer Engineering, Georgia Institute of Technology, Apr. 2005, 89 pages.

Takamatsu, et al., "Transparent conductive-polymer strain sensors for touch input sheets of flexible displays," *Journal of Micromechanics and Microengineering*, vol. 20, 2010, 6 pages.

Tsai, et al., "Fabrication of Graphene-based Micro Strain Gauge," NPL Management Ltd.—Internal, Oct. 15-16, 2012, 1 page.

* cited by examiner

FORCE DETECTION IN TOUCH DEVICES USING PIEZOELECTRIC SENSORS

CROSS REFERENCE TO RELATED APPLICATIONS

This application is a 35 U.S.C. § 371 application of PCT/US2013/032607, filed Mar. 15, 2013, and entitled "Force Detection in Touch Devices Using Piezoelectric Sensors," and further claims the benefit under 35 U.S.C. § 119(e) to U.S. provisional application No. 61/738,381, filed Dec. 17, 2012, and entitled "Force Detection In Touch Devices Using Piezoelectric Sensors," both of which are incorporated by reference as if fully disclosed herein.

Force Detection In Touch Devices Using Piezoelectric Sensors

BACKGROUND

The present application is directed to force detection and, more specifically, to force detection using a piezoelectric sensor.

Background

Touch displays have become increasingly popular in electronic devices. Smart phones, cell phones, tablet computers, notebook computers, and computer monitors, and so forth, are increasingly equipped with displays that are configured to sense touch as a user input. The touch may be sensed in accordance with one of several different touch sensing techniques including, but not limited to, capacitive touch sensing.

Touch sensitive devices generally provide position identification of where the user touches the device. The touching may include movement, gestures, and other effects related to position detection. For example, touch sensitive devices can provide information to a computing system regarding user interaction with a graphical user interface (GUI) of a display, such as pointing to elements, reorienting or repositioning elements, editing or typing, and other GUI features. In another example, touch sensitive devices can provide information to a computing system for a user to interact with an application program, such as relating to input or manipulation of animation, photographs, pictures, slide presentations, sound, text, other audiovisual elements, and so forth.

While the touch sensitive devices provide an input mechanism that provides an appearance that the user is interacting directly with element displayed in the GUI, the input is generally limited to the x-, y-positioning of the touch. In some cases, the input sensitivity has been increased to allow for multi-touch inputs, but this is still limited to positional constraints of the surface upon which the touch is sensed. Some applications and programs may benefit from additional input modes beyond that provided strictly by the touch sensing.

SUMMARY

The present application includes techniques directed to additional input modes for touch devices. In particular, embodiments may be directed to sensing force on a touch device using piezoelectric sensors. The force sensing may be in addition to the touch sensing to enable an additional user input mode for the touch device.

One embodiment, for example, may take the form of an apparatus including a touch device having a deformable device stack and a piezoelectric element positioned relative to the deformable device stack such that the piezoelectric element deforms with the deformable stack. Deformation of the piezoelectric element generates a signal having a magnitude discernable as representative of an amount of force applied to the touch device.

Another embodiment may take the form of a touch device having a dielectric cover glass (CG). The touch device further includes a piezoelectric structure adjacent the cover glass. The piezoelectric structure includes piezoelectric material, a first set of electrodes on a first surface of the piezoelectric material, and a second set of electrodes on a second surface of the piezoelectric material and located between the piezoelectric material and the cover glass. The piezoelectric material is a dielectric material and the second set of electrodes is configured to sense both electrical charge generated by the piezoelectric material and capacitance when a conductive material is brought into proximity with the cover glass.

As an alternative to the above, a single piezoelectric structure may be used and placed on one side of the CG. A set of electrodes may be sandwiched by the CG and the piezoelectric material. In such an embodiment, touch locations may be determined by a capacitive-sensing structure associated with the CG, while force may be estimated based on the lateral stretching of the electrodes operating in a $d_{33}$ mode.

While multiple embodiments are disclosed, still other embodiments of the present invention will become apparent to those skilled in the art from the following Detailed Description. As will be realized, the embodiments are capable of modifications in various aspects, all without departing from the spirit and scope of the embodiments. Accordingly, the drawings and detailed description are to be regarded as illustrative in nature and not restrictive.

DETAILED DESCRIPTION

Figure 1A:
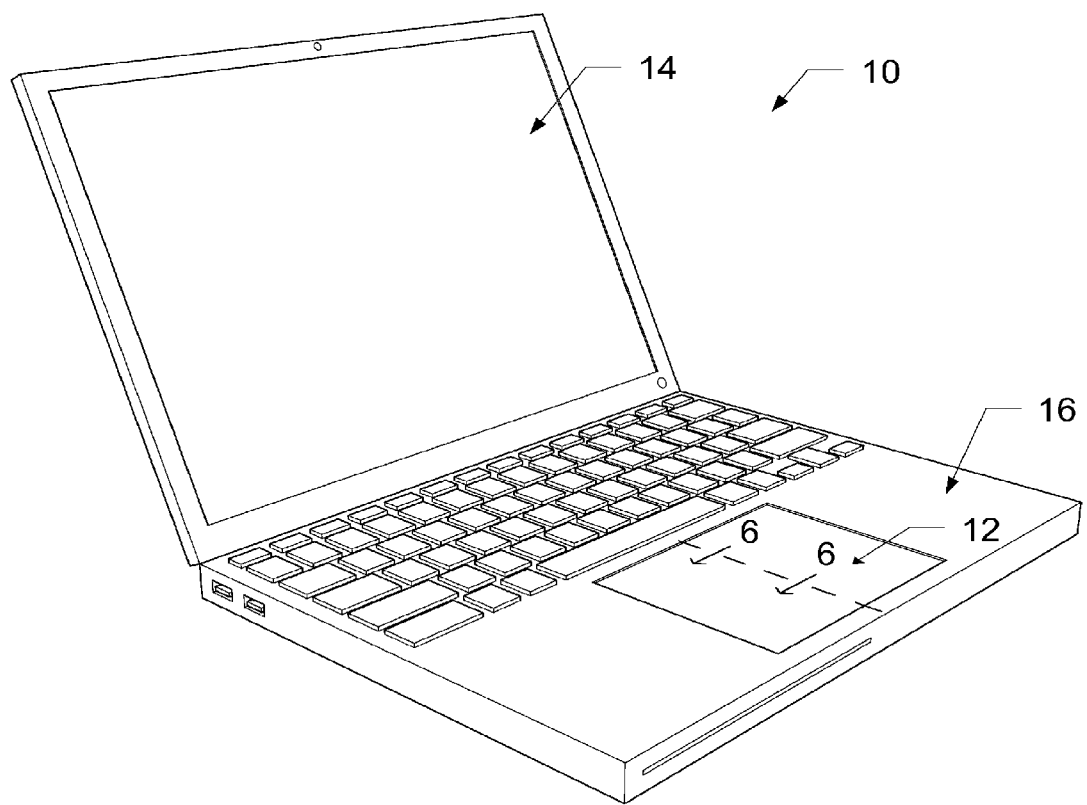
FIG. 1A is a front perspective view of a first example of a computing device incorporating a force sensing device.

As alluded to above, when interfacing with a GUI, or with an application program, it may be advantageous for the user to be able to indicate an amount of force applied when manipulating, moving, pointing to, touching, or otherwise interacting with, a touch device. For example, it might be advantageous for the user to be able to manipulate a screen element or other object in a first way with a relatively lighter touch, or in a second way with a relatively more forceful or sharper touch. In one such case, it might be advantageous if the user could move a screen element or other object with a relatively lighter touch, while the user could alternatively invoke or select that same screen element or other object with a relatively more forceful or sharper touch. Hence, having the ability to sense force might provide the touch device with greater capabilities, with additional input information for the touch device.

In some embodiments, the force sensing device may be incorporated into a variety of electronic or computing devices, such as, but not limited to, computers, smart phones, tablet computers, track pads, and so on. The force sensing device may be used to detect one or more user force inputs on an input surface and then a processor (or processing element) may correlate the sensed inputs into a force measurement and provide those inputs to the computing device. In some embodiments, the force sensing device may be used to determine force inputs to a track pad, a display screen, or other input surface.

The force sensing device may include an input surface, a force sensing module, a substrate or support layer, and optionally a sensing layer that may detect another input characteristic than the force sensing layer. The input surface provides an engagement surface for a user, such as the external surface of a track pad or the cover glass for a display. In other words, the input surface may receive one or more user inputs directly or indirectly.

The force sensing module may include an ultrasonic module or sensor that may emit and detect ultrasonic pulses. In one example, the ultrasonic module may include a plurality of sensing elements arranged in rows or columns, where each of the sensing elements may selectively emit an ultrasonic pulse or other signal. The pulse may be transmitted through the components of the force sensing device, such as through the sensing layer and the input surface. When the pulse reaches the input surface, it may be reflected by a portion of the user (e.g., finger) or other object, which may reflect the pulse. The reflection of the pulse may vary based on distance that the particular sensing element receiving the pulse is from the input. Additionally, the degree of attenuation of the pulse may also be associated with a force magnitude associated with the input. For example, generally, as the input force on the input surface increases, the contacting object exerting the force may absorb a larger percentage of the pulse, such that the reflected pulse may be diminished correspondingly.

In embodiments where it is present, the sensing layer may be configured to sense characteristics different from the force sensing module. For example, the sensing layer may include capacitive sensors or other sensing elements. In a specific implantation, a multi-touch sensing layer may be incorporated into the force sensing device and may be used to enhance data regarding user inputs. As an example, touch inputs detected by the sense layer may be used to further refine the force input location, confirm the force input location, and/or correlate the force input to an input location. In the last example, the force sensitive device may not use the capacitive sensing of the force sensing device to estimate a location, which may reduce the processing required for the force sensing device. Additionally, in some embodiments, a touch sensitive device may be used to determine force inputs for a number of different touches. For example, the touch positions and force inputs may be used to estimate the input force at each touch location.

In some specific embodiments described herein piezoelectric sensors may be used to determine a force applied to the touch device. In particular, a $d_{31}$ sensing mode of piezoelectric sensors may be utilized as a measure of the force applied to the touch device. The $d_{31}$ sensing mode is related to the stretching of the piezoelectric, as will be discussed in greater detail below with reference to example embodiments. In some embodiments, a $d_{33}$ sensing mode of piezoelectric sensors may be utilized in addition to or in lieu of the $d_{31}$ mode. The $d_{33}$ sensing mode is related to the compression of the piezoelectric sensor and, as such, may operate as a secondary piezoelectric effect adding to the total charge generated as the piezoelectric sensor stretches during a force sensing event.

The piezoelectric sensors may generally be configured to sense deformation of a touch display stack. As such, the piezoelectric sensors may be located within the display stack or attached to stack (e.g., laminated to the bottom of the display stack). For displays that include a backlight, such as a liquid crystal display (LCD), the piezoelectric sensor may be located between a rear polarizer and the backlight. Alternately, the piezoelectric sensor may be located on the back of the cover glass, whether or not the system includes a backlight.

FORCE SENSITIVE DEVICE AND SYSTEM

Figure 1B:
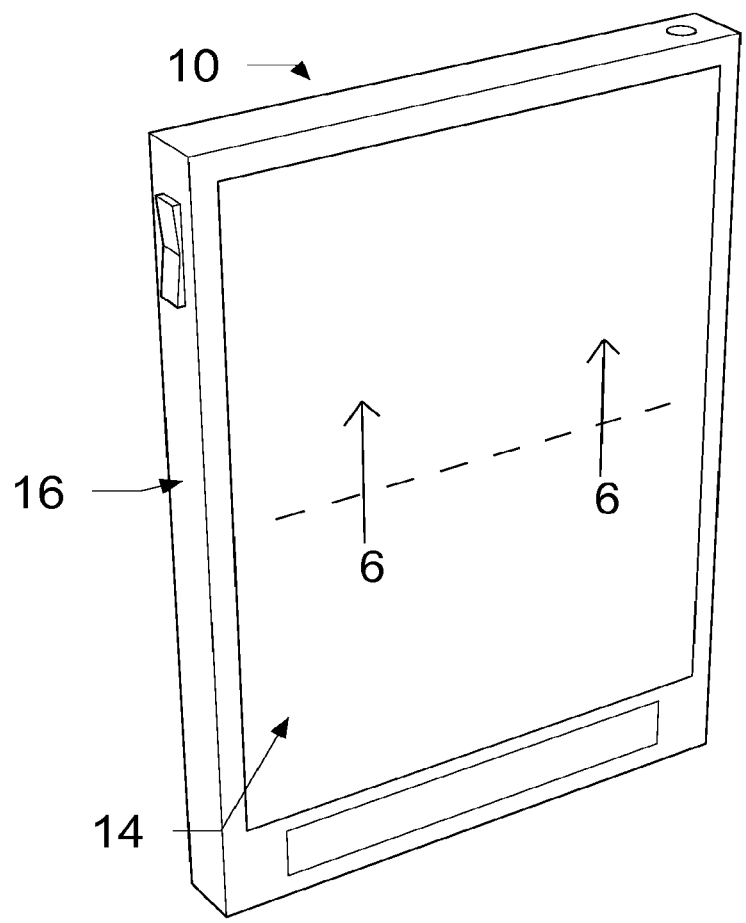
FIG. 1B is a front perspective view of a second example of a computing device incorporating a force sensing device.
Figure 1C:
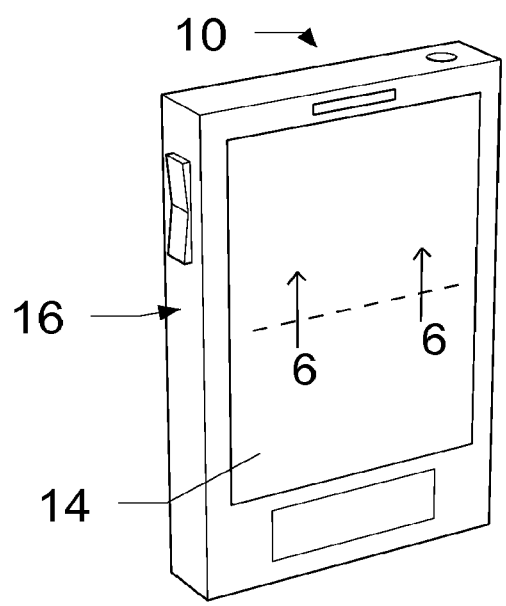
FIG. 1C is a front elevation view of a third example of a computing device incorporating the force sensing device.

Turning now to the figures, illustrative electronic devices that may incorporate the force sensing device will be discussed in more detail. FIGS. 1A-1C illustrate various computing or electronic devices that may incorporate the force sensing device. With reference to FIG. 1A, the force sensing device may be incorporated into a computer 10, such as a laptop or desktop computer. The computer 10 may include a track pad 12 or other input surface, a display 14, and an enclosure 16 or frame. The enclosure 16 may extend around a portion of the track pad 12 and/or display 14. In the embodiment illustrated in FIG. 1A, the force sensing device may be incorporated into the track pad 12, the display 14, or both the track pad 12 and the display 14. In these embodiments, the force sensing device may be configured to detect force inputs to the track pad 12 and/or the display 14.

In some embodiments, the force sensing device may be incorporated into a tablet computer. FIG. 1B is a top perspective view of a tablet computer including the force sensing device. With reference to FIG. 1B, the table computer 10 may include the display 14 where the force sensing device is configured to detect force inputs to the display 14. In addition to the force sensing device, the display 14 may also include one or more touch sensors, such as a multi-touch capacitive grid, or the like. In these embodiments, the display 14 may detect both force inputs, as well as position or touch inputs.

In yet other embodiments, the force sensing device may be incorporated into a mobile computing device, such as a smart phone. FIG. 1C is a perspective view of a smart phone including the force sensing device. With reference to FIG. 1C, the smart phone 10 may include a display 14 and a frame or enclosure 16 substantially surrounding a perimeter of the display 14. In the embodiment illustrated in FIG. 1C, the force sensing device may be incorporated into the display 14. Similarly to the embodiment illustrated in FIG. 1B, in instances where the force sensing device may be incorporated into the display 14, the display 14 may also include one or more position or touch sensing devices in addition to the force sensing device.

Additionally, the device 10 may include one or more buttons 15 and/or other input devices. In some embodiments, the button 15 may take the form of a home button. Further, in some embodiments, the button 15 may be integrated as part of a cover glass of the device and the piezoelectric based force measurements may be utilized to determine actuation of the button.

Figure 2:
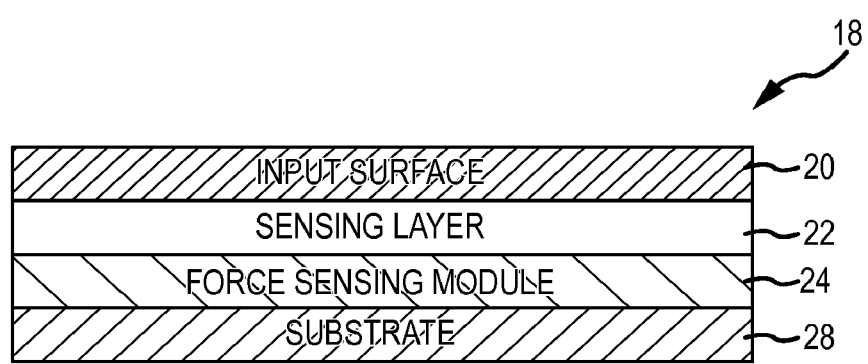
FIG. 2 is a simplified cross-section view of the computing device taken along line 2-2 in FIG. 1A.

The force sensing device will now be discussed in more detail. FIG. 2 is a simplified cross-section view of the electronic device taken along line 2-2 in FIG. 1A. With reference to FIG. 2, the force sensing device 18 may include an input surface 20, a sensing layer 22, a force sensing module 24 or layer, and a substrate 28. As discussed above with respect to FIGS. 1A-1C, the input surface 20 may form an exterior surface (or a surface in communication with an exterior surface) of the track pad 12, the display 14, or other portions (such as the enclosure) of the computing device 10. In some embodiments, the input surface 20 may be at least partially translucent. For example, in embodiments where the force sensing device 18 is incorporated into a portion of the display 14.

The sensing layer 22 may be configured to sense one or more parameters correlated to a user input. In some embodiments, the sensing layer 22 may be configured to sense characteristics or parameters that may be different from the characteristics sensed by the force sensing module 24. For example, the sensing layer 22 may include one or more capacitive sensors that may be configured to detect input touches, e.g., multi-touch input surface including intersecting rows and columns. The sensing layer 22 may be omitted where additional data regarding the user inputs may not be desired. Additionally, the sensing layer 22 may provide additional data that may be used to enhance data sensed by the force sensing module 24 or may be different from the force sensing module. In some embodiments, there may be an air gap between the sensing layer 22 and the force sensing module 24. In other words, the force sensing module 24 and sensing layer may be spatially separated from each other defining a gap or spacing distance.

The substrate 28 may be substantially any support surface, such as a portion of an printed circuit board, the enclosure 16 or frame, or the like. Additionally, the substrate 28 may be configured to surround or at least partially surround one more sides of the sensing device 18.

In some embodiments, a display (e.g., a liquid crystal display) may be positioned beneath the input surface 20 or may form a portion of the input surface 20. Alternatively, the display may be positioned between other layers of the force sensing device. In these embodiments, visual output provided by the display may be visible through the input surface 20.

As generally discussed above, the force sensing device may be incorporated into one or more touch sensitive device. It should be appreciated that although FIGS. 1A-1C illustrate specific examples of electronic devices, the techniques described herein may be applied to various other types of devices may implement the force measurement techniques described herein. For example, a notebook computer, tablet computers, desktop computers, track pads and so forth, all may implement piezoelectric based force measurement techniques, such as those discussed herein.

Figure 3:
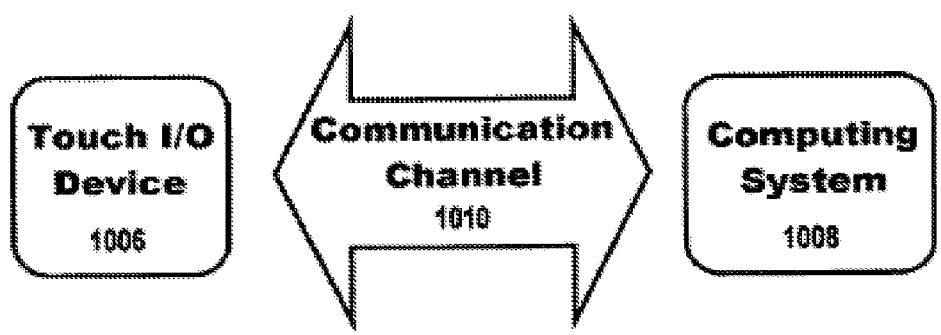
FIG. 3 is a block diagram of an example touch I/O device and a host computing system.

FIG. 3 illustrates an example block diagram showing an example embodiment including touch I/O device 1006 that can receive touch input for interacting with a computing system 1008. The touch I/O device 1006 may be the computing device 10 illustrated in FIGS. 1A-1C, or may be incorporated into the computing device 10. The communication may be via a wired or wireless communication channel 1010. Touch I/O device 1006 may be used to provide user input to computing system 1008 in lieu of or in combination with other input devices such as a keyboard, mouse, etc. One or more touch I/O devices 1006 may be used for providing user input to computing system 1008. Touch I/O device 1006 may be an integral part of computing system 1008 (e.g., touch screen on a laptop) or may be separate from computing system 1008.

Touch I/O device 1006 may include a touch sensitive panel which is wholly or partially transparent, semitransparent, non-transparent, opaque or any combination thereof. Touch I/O device 1006 may be embodied as a touch screen, touch pad, a touch screen functioning as a touch pad (e.g., a touch screen replacing the touchpad of a laptop), a touch screen or touchpad combined or incorporated with any other input device (e.g., a touch screen or touchpad disposed on a keyboard) or any multi-dimensional object having a touch sensitive surface for receiving touch input.

In one example, touch I/O device 1006 embodied as a touch screen may include a transparent and/or semitransparent touch sensitive panel partially or wholly positioned over at least a portion of a display. According to this embodiment, touch I/O device 1006 functions to display graphical data transmitted from computing system 1008 (and/or another source) and also functions to receive user input. In other embodiments, touch I/O device 1006 may be embodied as an integrated touch screen where touch sensitive components/devices are integral with display components/devices. In still other embodiments a touch screen may be used as a supplemental or additional display screen for displaying supplemental or the same graphical data as a primary display and to receive touch input.

Touch I/O device 1006 may be configured to detect the location of one or more touches or near touches on device 1006 based on capacitive, resistive, optical, acoustic, inductive, mechanical, chemical measurements, or any phenomena that can be measured with respect to the occurrences of the one or more touches or near touches in proximity to deice 1006. Software, hardware, firmware or any combination thereof may be used to process the measurements of the detected touches to identify and track one or more gestures. A gesture may correspond to stationary or non-stationary, single or multiple, touches or near touches on touch I/O device 1006. A gesture may be performed by moving one or more fingers or other objects in a particular manner on touch I/O device 1006 such as tapping, pressing, rocking, scrubbing, twisting, changing orientation, pressing with varying pressure and the like at essentially the same time, contiguously, or consecutively. A gesture may be characterized by, but is not limited to a pinching, sliding, swiping, rotating, flexing, dragging, or tapping motion between or with any other finger or fingers. A single gesture may be performed with one or more hands, by one or more users, or any combination thereof.

Computing system 1008 may drive a display with graphical data to display a graphical user interface (GUI). The GUI may be configured to receive touch input via touch I/O device 1006. Embodied as a touch screen, touch I/O device 1006 may display the GUI. Alternatively, the GUI may be displayed on a display separate from touch I/O device 1006. The GUI may include graphical elements displayed at particular locations within the interface. Graphical elements may include but are not limited to a variety of displayed virtual input devices including virtual scroll wheels, a virtual keyboard, virtual knobs, virtual buttons, any virtual UI, and the like.

A user may perform gestures at one or more particular locations on touch I/O device 1006 which may be associated with the graphical elements of the GUI. In other embodiments, the user may perform gestures at one or more locations that are independent of the locations of graphical elements of the GUI. Gestures performed on touch I/O device 1006 may directly or indirectly manipulate, control, modify, move, actuate, initiate or generally affect graphical elements such as cursors, icons, media files, lists, text, all or portions of images, or the like within the GUI. For instance, in the case of a touch screen, a user may directly interact with a graphical element by performing a gesture over the graphical element on the touch screen. Alternatively, a touch pad generally provides indirect interaction.

Gestures may also affect non-displayed GUI elements (e.g., causing user interfaces to appear) or may affect other actions within computing system 1008 (e.g., affect a state or mode of a GUI, application, or operating system). Gestures may or may not be performed on touch I/O device 1006 in conjunction with a displayed cursor. For instance, in the case in which gestures are performed on a touchpad, a cursor (or pointer) may be displayed on a display screen or touch screen and the cursor may be controlled via touch input on the touchpad to interact with graphical objects on the display screen. In other embodiments in which gestures are performed directly on a touch screen, a user may interact directly with objects on the touch screen, with or without a cursor or pointer being displayed on the touch screen.

Feedback may be provided to the user via communication channel 1010 in response to or based on the touch or near touches on touch I/O device 1006. Feedback may be transmitted optically, mechanically, electrically, olfactory, acoustically, or the like or any combination thereof and in a variable or non-variable manner.

Figure 4:
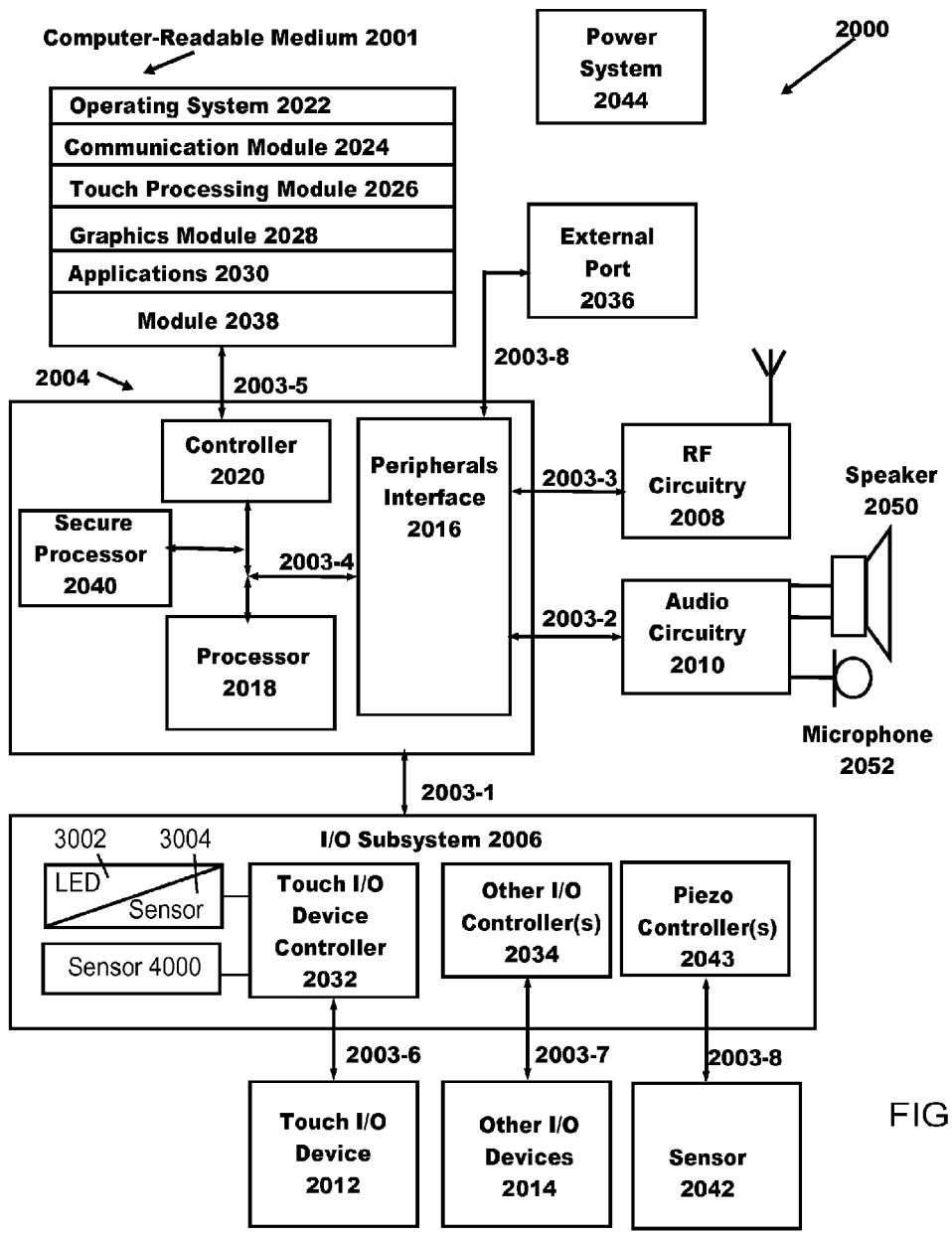
FIG. 4 is a block diagram of an example system that includes a touch I/O subsystem with force sensing.

Attention is now directed towards embodiments of a system architecture that may be embodied within any portable or non-portable device including but not limited to a communication device (e.g. mobile phone, smart phone), a multi-media device (e.g., MP3 player, TV, radio), a portable or handheld computer (e.g., tablet, netbook, laptop), a desktop computer, an All-In-One desktop, a peripheral device, or any other system or device adaptable to the inclusion of system architecture 2000, including combinations of two or more of these types of devices. FIG. 4 is a block diagram of one embodiment of system 2000 that generally includes one or more computer-readable mediums 2001, processing system 2004, Input/Output (I/O) subsystem 2006, radio frequency (RF) circuitry 2008 and audio circuitry 2010. These components may be coupled by one or more communication buses or signal lines 2003.

It should be apparent that the architecture shown in FIG. 4 is only one example architecture of system 2000, and that system 2000 could have more or fewer components than shown, or a different configuration of components. The various components shown in FIG. 4 can be implemented in hardware, software, firmware or any combination thereof, including one or more signal processing and/or application specific integrated circuits.

RF circuitry 2008 is used to send and receive information over a wireless link or network to one or more other devices and includes well-known circuitry for performing this function. RF circuitry 2008 and audio circuitry 2010 are coupled to processing system 2004 via peripherals interface 2016. Interface 2016 includes various known components for establishing and maintaining communication between peripherals and processing system 2004. Audio circuitry 2010 is coupled to audio speaker 2050 and microphone 2052 and includes known circuitry for processing voice signals received from interface 2016 to enable a user to communicate in real-time with other users. In some embodiments, audio circuitry 2010 includes a headphone jack (not shown).

Peripherals interface 2016 couples the input and output peripherals of the system to processor 2018 and computer-readable medium 2001. One or more processors 2018 communicate with one or more computer-readable mediums 2001 via controller 2020. Computer-readable medium 2001 can be any device or medium that can store code and/or data for use by one or more processors 2018. Medium 2001 can include a memory hierarchy, including but not limited to cache, main memory and secondary memory. The memory hierarchy can be implemented using any combination of RAM (e.g., SRAM, DRAM, DDRAM), ROM, FLASH, magnetic and/or optical storage devices, such as disk drives, magnetic tape, CDs (compact disks) and DVDs (digital video discs). Medium 2001 may also include a transmission medium for carrying information-bearing signals indicative of computer instructions or data (with or without a carrier wave upon which the signals are modulated). For example, the transmission medium may include a communications network, including but not limited to the Internet (also referred to as the World Wide Web), intranet(s), Local Area Networks (LANs), Wide Local Area Networks (WLANs), Storage Area Networks (SANs), Metropolitan Area Networks (MAN) and the like.

One or more processors 2018 run various software components stored in medium 2001 to perform various functions for system 2000. In some embodiments, the software components include operating system 2022, communication module (or set of instructions) 2024, touch processing module (or set of instructions) 2026, graphics module (or set of instructions) 2028, one or more applications (or set of instructions) 2030, and force module (or set of instructions) 2038. Each of these modules and above noted applications correspond to a set of instructions for performing one or more functions described above and the methods described in this application (e.g., the computer-implemented methods and other information processing methods described herein). These modules (i.e., sets of instructions) need not be implemented as separate software programs, procedures or modules, and thus various subsets of these modules may be combined or otherwise re-arranged in various embodiments. In some embodiments, medium 2001 may store a subset of the modules and data structures identified above. Furthermore, medium 2001 may store additional modules and data structures not described above.

Operating system 2022 includes various procedures, sets of instructions, software components and/or drivers for controlling and managing general system tasks (e.g., memory management, storage device control, power management, etc.) and facilitates communication between various hardware and software components.

Communication module 2024 facilitates communication with other devices over one or more external ports 2036 or via RF circuitry 2008 and includes various software components for handling data received from RF circuitry 2008 and/or external port 2036.

Graphics module 2028 includes various known software components for rendering, animating and displaying graphical objects on a display surface. In embodiments in which touch I/O device 2012 is a touch sensitive display (e.g., touch screen), graphics module 2028 includes components for rendering, displaying, and animating objects on the touch sensitive display.

One or more applications 2030 can include any applications installed on system 2000, including without limitation, a browser, address book, contact list, email, instant messaging, word processing, keyboard emulation, widgets, JAVA-enabled applications, encryption, digital rights management, voice recognition, voice replication, location determination capability (such as that provided by the global positioning system (GPS)), a music player, etc.

Touch processing module 2026 includes various software components for performing various tasks associated with touch I/O device 2012 including but not limited to receiving and processing touch input received from I/O device 2012 via touch I/O device controller 2032.

System 2000 may further include force module 2038 for performing the method/functions as described herein in connection with FIGS. 5-13. Force module 2038 may at least function to determine if a force threshold has been exceeded. Module 2038 may also interact with applications, software, hardware and/or other devices within the system 2000. Module 2038 may be embodied as hardware, software, firmware, or any combination thereof. Although module 2038 is shown to reside within medium 2001, all or portions of module 2038 may be embodied within other components within system 2000 or may be wholly embodied as a separate component within system 2000.

The force module 2038 may generally relate to interpretation of force measurements and/or their effect on the current operating context of the system 2000. Generally, the force module 2038 and the touch processing module 2026 may be configured to operate in cooperation to determine the effect of a force measurement. For example, the touch processing module 2026 may be utilized to help discern a location of touch on a surface. This location information may be used in determining an effect of a force measurement. Specifically, if a threshold amount of force is sensed over the button 15 (FIG. 10), it may actuate the button, whereas the same force at a different location would not actuate the button. Moreover, the cooperation between the touch and force modules allows multi-force discernment in some embodiments. For example, similar to multi-touch, a determination of a threshold amount of force in multiple locations on the surface may be interpreted as a particular user input different from a threshold force measured at a single location. It should be appreciated that in some embodiments, the touch and force modules may operate entirely independently from each other.

I/O subsystem 2006 is coupled to touch I/O device 2012, the piezoelectric sensor 2042 and one or more other I/O devices 2014 for controlling or performing various functions. Touch I/O device 2012 communicates with processing system 2004 via touch I/O device controller 2032, which includes various components for processing user touch input (e.g., scanning hardware). The piezoelectric sensor 2042 is communicates with piezoelectric controllers 2043 as part of the force determination for force measurements. In particular, for example, signals generated by the piezoelectric sensor 2042 are controlled or otherwise received by the piezoelectric controller 2043 as part of the I/O subsystem 2006. One or more other input controllers 2034 receives/sends electrical signals from/to other I/O devices 2014. Other I/O devices 2014 may include physical buttons, dials, slider switches, sticks, keyboards, touch pads, additional display screens, or any combination thereof.

If embodied as a touch screen, touch I/O device 2012 displays visual output to the user in a GUI. The visual output may include text, graphics, video, and any combination thereof. Some or all of the visual output may correspond to user-interface objects. Touch I/O device 2012 forms a touch-sensitive surface that accepts touch input from the user. Touch I/O device 2012 and touch screen controller 2032 (along with any associated modules and/or sets of instructions in medium 2001) detects and tracks touches or near touches (and any movement or release of the touch) on touch I/O device 2012 and converts the detected touch input into interaction with graphical objects, such as one or more user-interface objects. In the case in which device 2012 is embodied as a touch screen, the user can directly interact with graphical objects that are displayed on the touch screen. Alternatively, in the case in which device 2012 is embodied as a touch device other than a touch screen (e.g., a touch pad) the user may indirectly interact with graphical objects that are displayed on a separate display screen embodied as I/O device 2014.

Touch I/O device 2012 may be analogous to the multi-touch sensitive surface described in the following U.S. Pat. Nos. 6,323,846; 6,570,557; and/or 6,677,932; and/or U.S. Patent Publication 2002/0015024A1, each of which is hereby incorporated by reference.

Embodiments in which touch I/O device 2012 is a touch screen, the touch screen may use LCD (liquid crystal display) technology, LPD (light emitting polymer display) technology, OLED, or OEL (organic electro luminescence), although other display technologies may be used in other embodiments.

Feedback may be provided by touch I/O device 2012 based on the user's touch input as well as a state or states of what is being displayed and/or of the computing system. Feedback may be transmitted optically (e.g., light signal or displayed image), mechanically (e.g., haptic feedback, touch feedback, force feedback, or the like), electrically (e.g., electrical stimulation), olfactory, acoustically (e.g., beep or the like), or the like or any combination thereof and in a variable or non-variable manner.

The I/O subsystem 2006 may include and/or be coupled to one or more sensors configured to be utilized in the force determination. In particular, the I/O subsystem 2006 may include an LED 3002 and a sensor 3004, and/or an additional sensor 4000. Each of the LED 3002, sensor 3004 and additional sensors 4000 may be coupled to the touch I/O device controller 2032, or another I/O controller (not shown). The LED 3002, sensor 3004 and additional sensor 4000 may be utilized, for example, as part of a proximity sense routine to determine if a user or object is close the system. If the user or object is not near the system 2000, any force measurement and/or sensed touch may be false and, therefore, discarded.

System 2000 also includes power system 2044 for powering the various hardware components and may include a power management system, one or more power sources, a recharging system, a power failure detection circuit, a power converter or inverter, a power status indicator and any other components typically associated with the generation, management and distribution of power in portable devices.

In some embodiments, peripherals interface 2016, one or more processors 2018, and memory controller 2020 may be implemented on a single chip, such as processing system 2004. In some other embodiments, they may be implemented on separate chips.

Figure 5A:
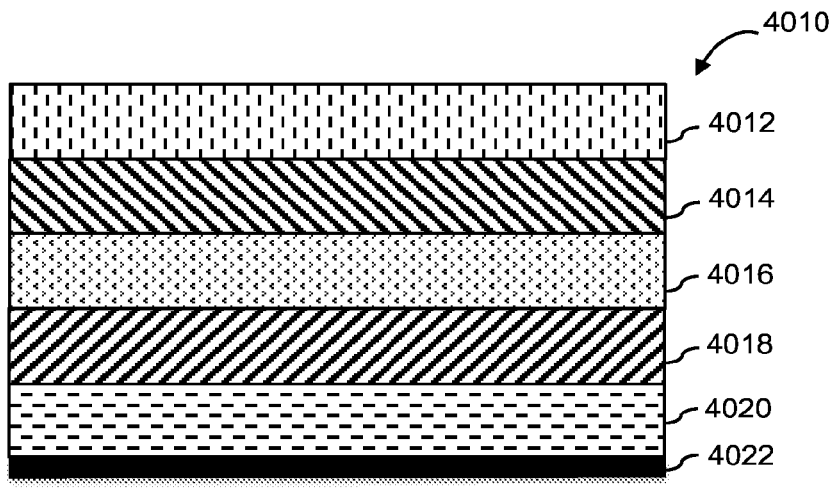
FIG. 5A is a cross-sectional view of device of FIG. 1C taken along line 5-5 and illustrating a display stack with piezoelectric element for force sensing.
Figure 10:
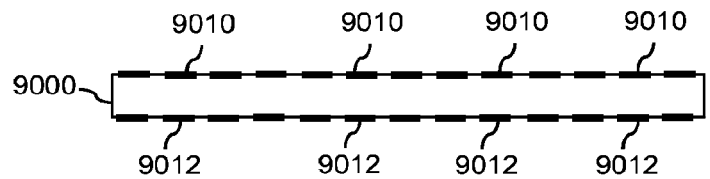
FIG. 10 illustrates an alternative embodiment in which top and bottom electrodes on a piezoelectric element run in the same direction.

Turning to FIG. 5A, a cross-sectional view taken along line 5-5 in FIG. 10 illustrates layers of an example display stack 4010. Generally, the display stack 4010 may include the display 14 of FIG. 10 and the layers that constitute the display. For example, a top layer in the display stack may be a cover glass 4012. The cover glass 4012 may be coupled to a front polarizer 4016, a display 4018, and a rear polarizer 4020 with some adhesive 4014. The adhesive 4014 may be an optically clear adhesive. The front and rear polarizers 4016, 4020 may take any suitable form and may include polarizers that are known and used in the art. A piezoelectric element 4022 or other force sensing element, may be attached to the rear polarizer in some embodiments. Attaching the piezoelectric element 4022 to the rear polarizer 4020 allows the piezoelectric element to deflect with the layers of the display stack 4010 as it is subjected to force.

Figure 5B:
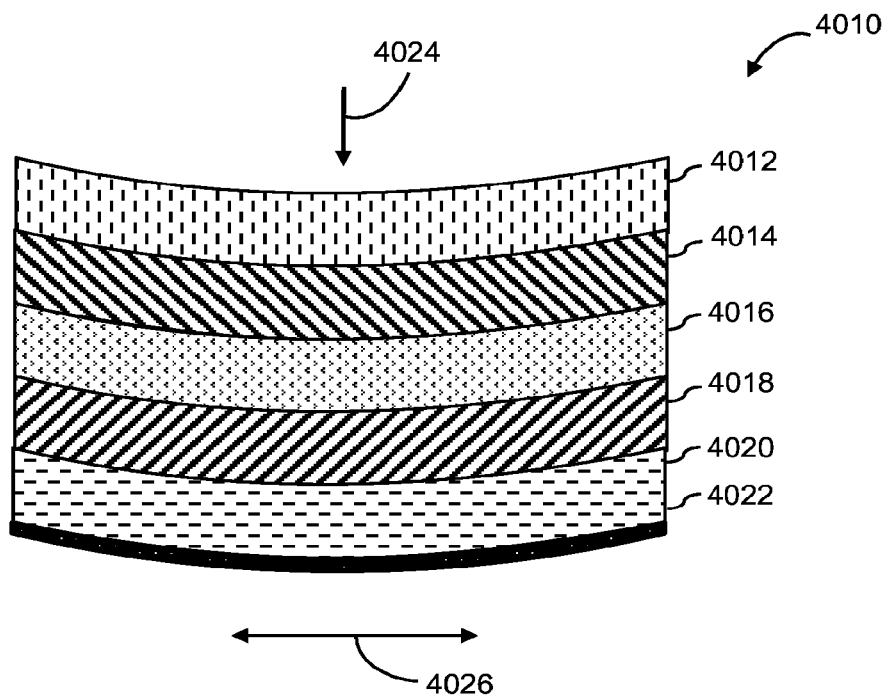
FIG. 5B illustrates the device stack of FIG. 5A deflecting due to force and stretching the piezoelectric element.
Figure 6A:
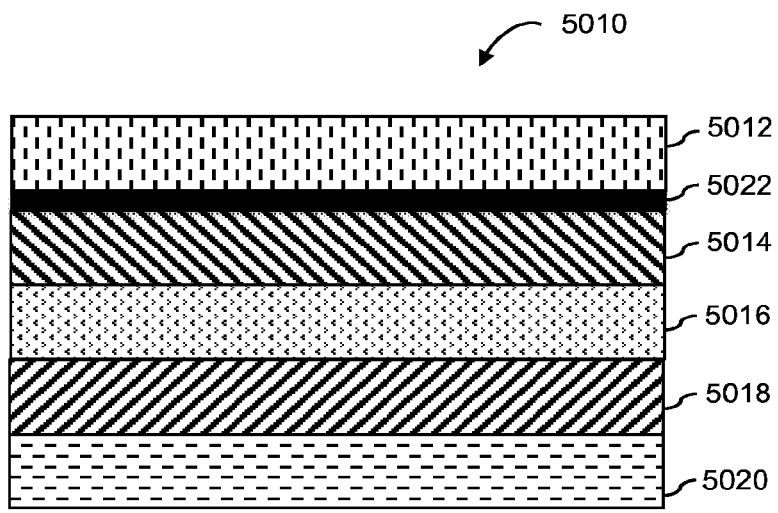
FIG. 6A is a cross-sectional view of device of FIG. 1C taken along line 5-5 and illustrating a display stack with piezoelectric element for force sensing positioned directly under the cover glass in accordance with an alternative embodiment.
Figure 6B:
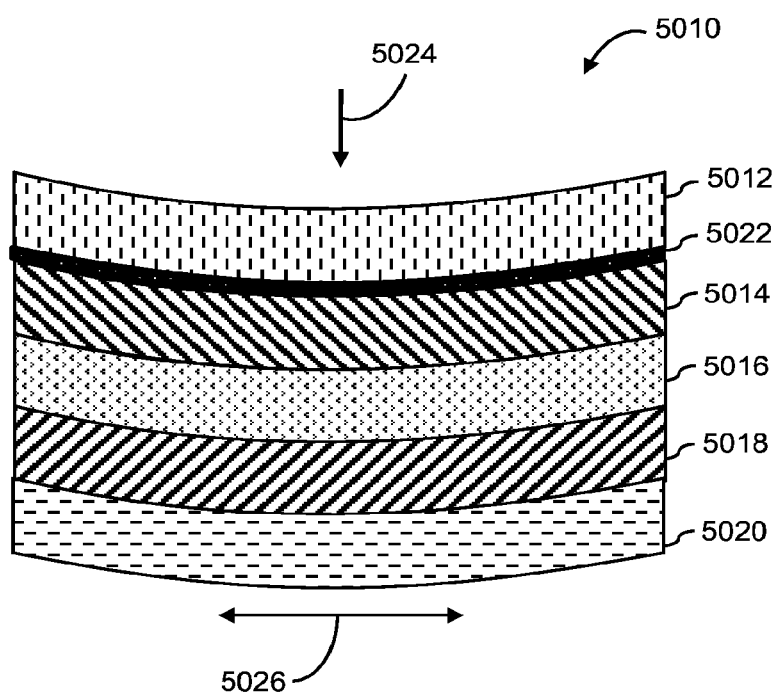
FIG. 6B illustrates the device stack of FIG. 6A deflecting due to force and stretching the piezoelectric element.

FIG. 5B illustrates a force (indicated by arrow 4024) applied to the display stack 4010. The force causes the displacement or deflection of the layers of the display stack 4010. In particular, the cover glass 4012 is deflected by the force and the deflection translates through the other layers in the stack. The deflection of the piezoelectric element 4022 results in expansion or stretching of the piezoelectric element, thereby generating a signal. Specifically, in the case of a piezoelectric element, an electrical charge may be generated by the deflection. Generally, the primary mode of charge generation may be a $d_{31}$ mode (e.g., the mode associated with the stretching of the piezoelectric element 4022). The $d_{31}$ mode is illustrated by the arrow 4026. A secondary mode of charge generation may be a $d_{33}$ mode which generally is related to compression of the piezoelectric element 4022. It should be appreciated, however, that in some embodiments, the $d_{33}$ mode may be a primary mode of charge generation and the $d_{31}$ mode may be a secondary mode.

In other embodiments, the piezoelectric elements may be located at different positions within a display stack. The positioning may depend upon the type of display into which the piezoelectric element is placed. Additionally, or alternatively, the location of the piezoelectric element within the stack may depend upon the optical characteristics of the piezoelectric element. For example, if the piezoelectric element may have a negative impact upon the image of the display, then it may be preferable to position the piezoelectric behind the rear polarizer and display.

FIG. 5A illustrates an embodiment in which a piezoelectric element 5022 is positioned within a display stack 5010 directly under the cover glass 5012. That is, the piezoelectric element 5022 is in front of the adhesive 5014, the front polarizer 5016, the display 5018 and the rear polarizer 5020. FIG. 5B illustrates the deflection of the display stack 5010 when a force 5024 is applied to the stack. The piezoelectric element 5022 deflects with the cover glass 5012 causing stretching (arrow 5026) and generating a charge. In some cases, the piezoelectric may deflect more sharply when mounted directly under the cover glass relative to when it is mounted under the rear polarizer or other layer in the stack. However, the piezoelectric element 5022 should have minimal optical effects. That is, the piezoelectric element 5022 is transparent and does not otherwise distort the image from the display 5018.

Figure 7:
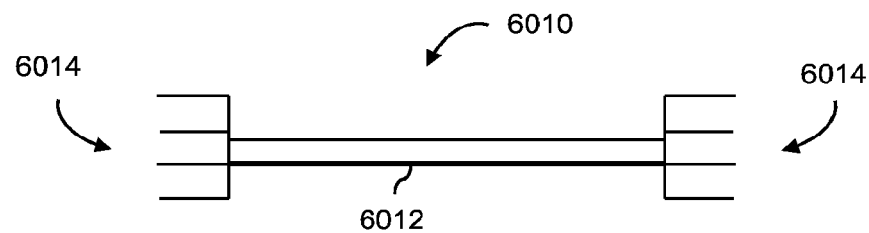
FIG. 7 illustrates a display stack and an electrode of a piezoelectric element with terminals for connecting into a component and/or system architecture.

The electrical structure that communicates the electrical charge from the piezoelectric elements may take any suitable form. Several different embodiments, are presented herein as examples. FIG. 7 illustrates a display stack 6010 and an electrode 6012 of a piezoelectric element. The illustrated electrode 6012 is a conductive sheet electrically coupled with terminals 6014. In some embodiments, the terminals 6014 may function as drive lines. It should be appreciated that the illustrated electrode 6012 may take any suitable form may generally represent sheet electrodes that may be located on either side of a piezoelectric element to conduct the electrical charge generated by the piezoelectric element to a controller or other device that may monitor changes to the charge generated by the piezoelectric.

Figure 8:
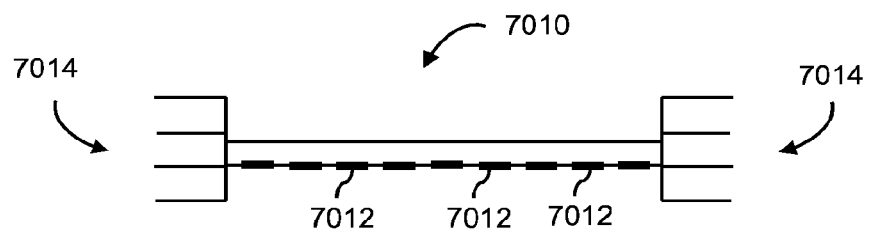
FIG. 8 illustrates a display stack with a set of electrodes of a piezoelectric element in accordance with an alternative embodiment, wherein the set of electrodes take the form of strips of conductive material.

FIG. 8 illustrates an alternative embodiment with a set of electrodes 7012 that may take the form of strips of conductive material. The strips of conductive material constituting the electrodes 7012 may be oriented in a generally parallel configuration. The use of the strips of electrodes may allow the force detection to be localized. That is, the location of the force input may be localized by the piezoelectric element. The electrodes 7012 may be positioned at any suitable location within the display stack 7010. The electrodes are also electrically coupled to the terminals 7014. The terminals may function as drive lines in some embodiments.

Figure 9:
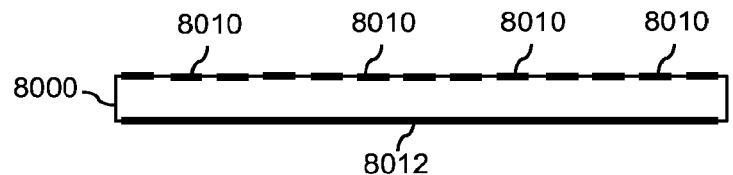
FIG. 9 illustrates a piezoelectric element with electrodes on opposing sides of the element to sense a generated electrical charge.

FIG. 9 illustrates a piezoelectric element 8000 with electrodes on opposing sides of the element. A top set of electrodes 8010 may include parallel electrodes and a bottom electrode may take the form of a conductive sheet 8012. In an alternative embodiment, the bottom electrodes 8012 may take the form of a series of parallel electrode strips extending in a direction perpendicular to that of the top electrodes 8010.

FIG. 10 illustrates an alternative embodiment in which the top electrodes 9010 and the bottom electrodes 9012 about a piezoelectric element 9000 run in the same direction. That is, the electrodes 9010, 9012 are conductive strips that are parallel with respect to other electrodes in the same layer and the electrodes on the opposite side of the piezoelectric element 9000.

Figure 11:
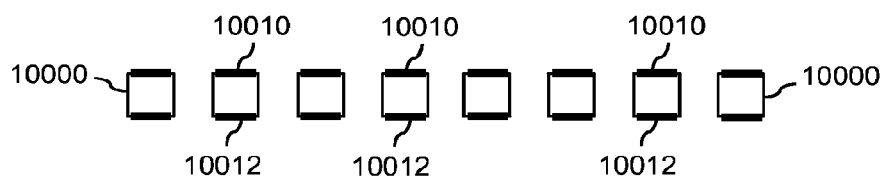
FIG. 11 illustrates an embodiment in which multiple, discrete piezoelectric elements are provided with discrete electrodes.

FIG. 11 illustrates an embodiment in which multiple, discrete piezoelectric elements 10000 are provided. Each discrete piezoelectric element 10000 has its own set of electrodes 10010, 10012. The piezoelectric elements 10000 and the electrodes 10010, 10012 may each be elongate members in some embodiments.

The piezoelectric elements 10000 may have a length so that they may be coupled to the display stack and flex when force is applied to the stack. In other embodiments, the piezoelectric elements 10000 and the electrodes 10010, 10012 may take another geometrical form. For example, the piezoelectric elements 10000 may be cubical, rectangular or any other shape. As such, the piezoelectric elements 10000 may be configured as discrete pixels that may sense force at a particular location.

Figure 12:
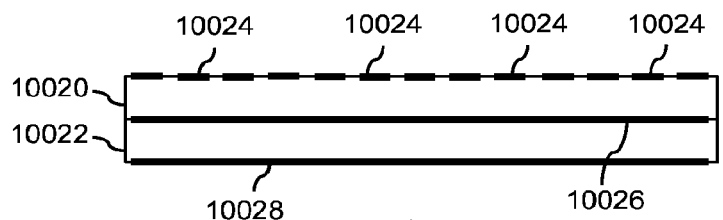
FIG. 12 illustrates an embodiment in which multiple piezoelectric elements are provide with an electrode sheet positioned therebetween.

FIG. 12 illustrates an embodiment in which multiple piezoelectric elements are provide with an electrode sheet 10026 positioned therebetween. A top piezoelectric element 10020 may have a set of electrodes 10024 having the form of electrically conductive strips oriented in a first direction and a bottom piezoelectric element 10022 has a set of electrodes 10028 having the form of electrically conductive strips oriented in a second direction. The second direction may be offset from the first direction by some offset angle. The second direction may generally be perpendicular to that of the first direction in some embodiments. This configuration may allow for location of a force input to be discerned by the piezoelectric structure, as the electrodes may generally form a grid and each electrode may be coupled to a discretely addressed input line. As one example, an active-matrix sensor arrangement may be employed, with field-effect transistors (or other suitable switches) at each row-column intersection. In such an embodiment, row/column conductors may interconnect the FETs and the piezoelectric elements at the row and column intersections. Alternatively, a projective-scan type architecture may be employed.

In addition to the electrode strips discussed herein, an array or grid of smaller electrodes may be employed. Each electrode may function to sense force (or strain) separately from other electrodes in the array and may be driven and/or sensed separately from the other array electrodes.

In each of the foregoing elements, the force measurement is derived from measuring local deformation. The local deformation is a function of force translated through the cover glass and/or the display stack. That is, the display stack curves and the bottom of the stack strains (e.g., stretches). Thus, the force measurement typically is not a measurement of the deflection or displacement of the stack or cover glass. The piezoelectric element of the sensors may be laminated to the bottom of the stack. In backlit displays, such as liquid crystal displays, the piezoelectric elements may be located behind the rear polarizer, but in front of the backlight. Because they are located in front of the backlight, they are generally transparent. The transistors and electrodes associated with the piezoelectric elements may be formed through a process that provides for transparency, such as an indium tin oxide (ITO) deposition process. Additionally, as discussed above, a pixel or grid geometry of electrodes may be created so that force location may be determined. That is, a single film with many electrodes may be used. In such embodiments, a multi-force determination may be made, or an estimate of multi-force inputs may be approximated. That is, discrete, simultaneous force inputs at different locations may be discerned.

Alternatively, the piezoelectric based sensors may be placed on the back of the display cover glass while providing the same advantages discussed above.

It should be appreciated that embodiments discussed herein may be boundary-independent. That is, neither the piezoelectric film nor the element to which it is applied (such as a display) need be bounded with a rubber or other elastic boundary, such as a gasket, in order to operate. Instead, force determination may be performed even without such a boundary.

As multiple modes of charge generation may be active (e.g., $d_{33}$ mode and $d_{31}$ mode), a calibration may be performed to account for both or all active modes. Hence, the force determination may take into account all of the generated charge as a result of force, even if one mode is dominant. As one example of calibration, various known forces may be applied to specific locations on the force-sensing surface of the device. This may occur, for example, in a factory prior to shipment or sale of the device. Force may be applied across the device's surface, including at locations near or on a boundary of the force-sensing area. The output of the piezoelectric sensors may be read out and generated as a strain map. This strain map may be used to calculate calibration constants for the different locations at which force was applied; since the applied forces are known, they may be correlated to the output strain map and the various constants required to scale the force to the output may be determined. Calibration constants may vary across the force-sensing surface or may be relatively constant. Generally, the calibration constants may relate sensor signal to force or strain to force, and may be stored in a memory of the device. These constants may later be retrieved and used to estimate a force applied to a particular location. Certain embodiments may employ plate deformation-based algorithms to correlate a deflection map of the force-sensing surface to one or more force inputs.

The piezoelectric elements generate their own signal and do not have to be powered. However, the signal generated may generally be low energy. This low energy signal may be difficult to sense as there may be noise and/or leakage in the circuit. The electrical model may take one of several suitable forms. For example, in one embodiment, a high pass filter may be applied. However, the high pass filter effect may make low frequency elements in the signal difficult to read. In another embodiment, the signal may be amplified and/or processed to help obtain suitable readings. For example, a low leakage op amp may be implemented to limit drift. Additionally, a shield may be provided in some embodiments to protect against capacitance from a user's finger. For example, a thin-film transistor layer in the display stack may be grounded to serve as a shield. Further, temperature changes may affect the piezoelectric element and steps may be taken to mitigate any temperature change impact. For example, temperature may be canceled out by using multiple sensors (e.g., one for thermal effect and the other for both thermal effects and force). For example, a dual mode rejection method may be implemented. Alternatively, films that are not thermally sensitive may be used or a film that has a non-uniform directional response may be used. The directional properties may be used to cancel out thermal effects. In one example, the films may be stacked or positioned side by side so that their respective thermal effects cancel each other out.

As may be appreciated, in the presently disclosed embodiments the piezoelectric element and electrodes are located within the display stack and are not exposed. Additionally, the force sensing may not merely be binary. Rather, force pixels may be sensed so that a multi-force parameter may be read.

In some embodiments, a force sensing structure may further be utilized as a touch input structure. As piezoelectric elements are generally dielectric in nature (e.g., they are not conductive), they may be utilized as a dielectric member for a capacitor. That is, when a user's finger (or other capacitively-sensed element, such as a capacitive stylus) is in proximity to the cover glass surface, the position of the finger/element may be sensed by the touch sensor. The touch sensor may use the piezoelectric element as one plane or part of a mutual-capacitance array to detect such touches or near-touch events. Likewise, force applied to the cover glass may be translated into strain on the piezoelectric element, thereby generating a charge that may be read and utilized to approximate, estimate or otherwise measure the force. This generated charge may further modulate the capacitance of the touch sensor, and may be accounted for when detecting a touch event. Additionally, the cover glass of a device may serve as a dielectric for another capacitive circuit. By multiplexing the operation of a piezoelectric element, it may function as both a force sensor and a touch sensor. In particular, the force and touch sensing structure may generally take the form of a piezoelectric structure with electrode(s) located on either side of the piezoelectric element. The sheets may be used to sense charge generated by deflection of the piezoelectric elements. Additionally, a top electrode(s) may be configured to capacitively couple with a conductive element interacting with a display screen. For example, the electrode(s) may be configured to capacitively couple with a user's finger. The electrodes may be configured as self-capacitive members or mutual capacitive members (e.g., a bottom layer may be non-patterned).

Figure 13:
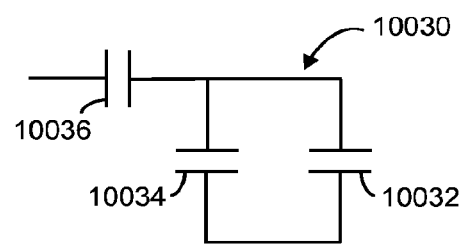
FIG. 13 generally illustrates a schematic of the electrical components of the piezoelectric force and touch sensor.

FIG. 13 generally illustrates a schematic of the electrical components of the piezoelectric force and touch sensor 10030. Generally, three unique capacitive circuits may be created. A first capacitive circuit 10032 may be parasitic in nature. That is, it may be incurred through the proximity of the electrodes of the piezoelectric element to another conductive layer or element. A second capacitive circuit 10034 may be formed by the parallel electrodes on either side of the piezoelectric element. This capacitive circuit 10034 may be in parallel with the parasitic circuit 10032. A final capacitive circuit 10036 may be created by bringing a capacitive element into proximity with a top electrode of the piezoelectric element. This capacitive circuit 10036 is in series with the other two capacitive circuits 10032, 10034. Changes in this capacitive circuit 10036 may be monitored to determine when a finger (or other capacitive element) is brought into proximity with the sensor 10030 or touching a screen with which the sensor is associated. The sensing operations may be multiplexed so that any time one of force or touch is being sensed by the touch force sensor. The generated charge at the piezoelectric element (e.g., the generated charge used to estimate force) is not created due to a gap change. Rather, this charge may be proportional to the amount of force that is applied.

The piezoelectric based force sensor is an impulse sensor due to the nature of the piezoelectric element. That is, when the piezoelectric element is deformed to generate a charge, the charge generated is an impulse signal. A circuit may be provided to integrate the impulse signal and determine how much force is applied and how the force changes. Generally, the size of the generated impulse signal is linearly related to the amount of force applied. The touch sensor, alternatively, does not generate an impulse signal.

The piezoelectric force and touch sensor 10030 may generally be created by any suitable process. In one embodiment, ITO electrodes may be formed on an underside of a device cover glass. A piezoelectric element may be positioned over the ITO electrodes and a second set of ITO electrodes may be positioned or deposited on the piezoelectric element. The ITO electrodes may take any suitable form. In one embodiment, the ITO electrodes may be sheets. In another embodiment, the ITO may be strips or pixels to enable a location determination of both the force and touch sensing. In some embodiments, the piezoelectric element and electrodes may take the form of a piezoelectric package that may be installed beneath a cover glass. Example piezoelectric films that may be utilized in certain embodiments discussed herein include poly-L-lactic acid piezoelectric (PLLA) elements, some of which are manufactured and distributed by Murata Manufacturing Co., Ltd. One example of such a film is a $d_{14}$ mode piezoelectric material cut in a 45 degree orientation in order to permit operation in a $d_{31}$ mode. As another example, a polyvinylidene fluoride (PVDF) material may be used in certain applications. In embodiments employing a PVDF material as a strain sensor, thermal effects on the PVDF may be accounted for, or the PVDF may be thermally isolated.

The piezoelectric film may generally have a high transparency. Hence, the piezoelectric film generally does not appreciably impact the optics of the system in which it is incorporated (at least as seen by the human eye), which means it may be installed directly under the cover glass. This may prove advantageous, as it may be attached only to the cover glass rather than to other components or layers in a display stack. Therefore, the deformation of the piezoelectric element is dependent only upon the deformation of the cover glass. Also, the film, or other transparent piezoelectric element that may be installed directly under the cover glass may be used with any display technology. That is, it is not display device dependent. Additionally, because the force and touch sensor may be installed directly under the cover glass, there is no change to existing display architecture. The piezoelectric based sensor may be directly inserted into existing architecture.

Timing Diagram

Figure 14A:
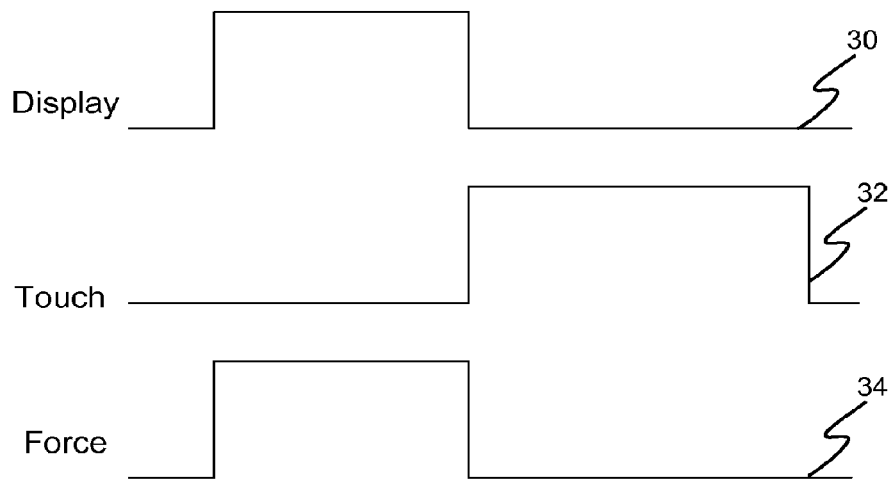
FIG. 14A is a first example of a timing diagram for the computing device.
Figure 14B:
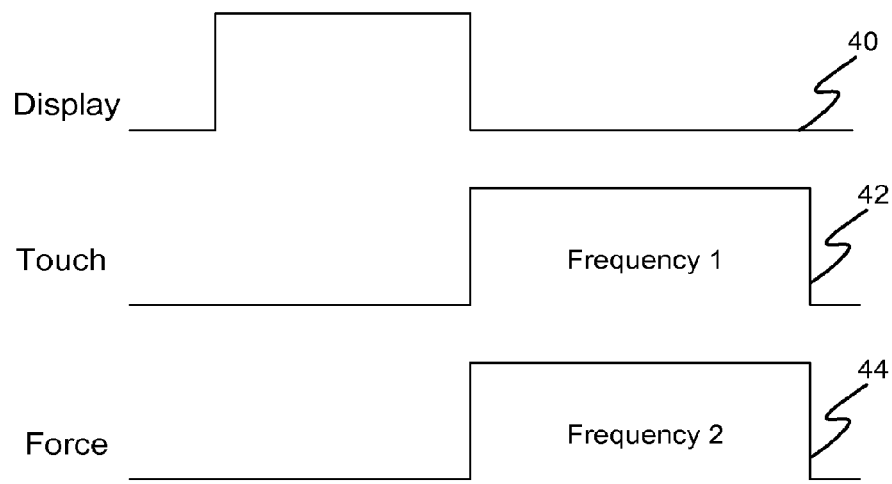
FIG. 14B is a second example of a timing diagram for the computing device.
Figure 14C:
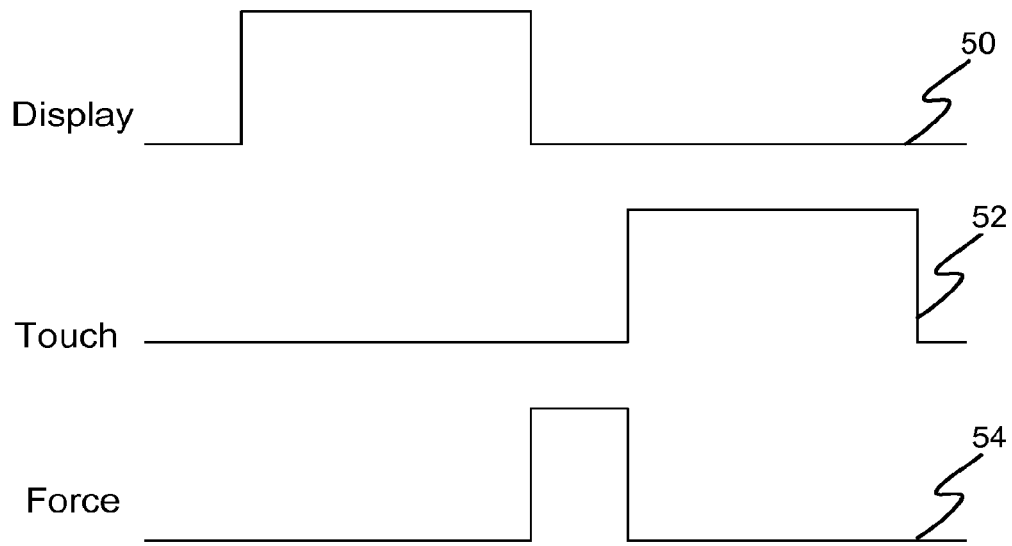
FIG. 14C is a third example of a timing diagram for the computing device.

In some embodiments various components of the computing device and/or touch screen device may be driven or activated separately from each other and/or on separate frequencies. Separate drive times and/or frequencies for certain components, such as the display, touch sensor or sensors (if any), and/or force sensors may help to reduce cross-talk and noise in various components. FIGS. 14A-14C illustrate different timing diagram examples, each will be discussed in turn below. It should be noted that the timing diagrams discussed herein are meant as illustrative only and many other timing diagrams and driving schemes are envisioned.

With respect to FIG. 14A, in some embodiments, the display 14 and the force sensor 18 may be driven substantially simultaneously, with the touch sensitive component 1001 being driven separately. In other words, the driver circuits for the force sensing device 18 may be activated during a time period that the display is also activated. For example, the display signal 30 and the force sensing signal 34 may both be on during a first time period and then may both inactive as the touch sensing device signal 32 is activated.

With respect to FIG. 14B, in some embodiments, the touch and force devices may be driven at substantially the same time and the display may be driven separately. For example, the display signal 40 may be set high (e.g., active) during a time that the touch signal 42 and the force signal 44 may both be low (e.g., inactive), and the display signal 40 may be low while both the touch signal 42 and the force signal 44 are high. In this example, the touch signal 42 and the force signal 44 may have different frequencies. In particular, the touch signal 42 may have a first frequency F1 and the force signal 44 may have a second frequency F2. By utilizing separate frequencies F1 and F2, the computing device may be able to sample both touch inputs and force inputs at substantially the same time without one interfering with the other, which in turn may allow the processor to better correlate the touch inputs and the force inputs. In other words, the processor may be able to correlate a force input to a touch input because the sensors may be sampling at substantially the same time as one another. Additionally, the separate frequencies may reduce noise and cross-talk between the two sensors. Although the example in FIG. 14B is discussed with respect to the force and touch signals, in other embodiments each of the drive signal, the touch signal, and/or the force signal may have separate frequencies from each other and may be activated simultaneously or correspondingly with another signal.

With respect to FIG. 14C, in some embodiments, various components in the computing device may be driven separately from one another. For example, the display signal 50 may be driven high, while both the touch signal 52 and the force signal 54 are low. Additionally, the touch signal 52 may be high while both the force signal 54 and the display signal 50 are low and similarly the force signal 54 may be high while both the display signal 50 and the touch signal 52 are low. In these examples, the force signal's active period may be positioned between the active periods of the display and the touch sensor. In other words, the force sensor 18 may be driven between the display being driven and the touch sensors being driven. In these examples, each of the devices may be active at separate times from one another, thereby reducing inter-system noise. In some embodiments, the force sensor may have a shorter drive time than the display or touch signals; however, in other embodiments, the force sensor may have a drive time that is substantially the same as or longer than the display and/or touch sensor.

The foregoing describes some example techniques using piezoelectric elements to sense force in a touch sensitive stack. The sensing of force gives an additional input mode for touch sensitive input devices. Although the foregoing discussion has presented specific embodiments, persons skilled in the art will recognize that changes may be made in form and detail without departing from the spirit and scope of the embodiments.

The invention claimed is:

1. An apparatus comprising:
an input surface configured to deform in response to a force exerted on the input surface;
a display positioned below the input surface;
a touch sensor disposed below and coupled to the input surface; and
a piezoelectric element array disposed below the display such that the piezoelectric element array deforms with the input surface in response to the force exerted, wherein
the piezoelectric element array generates a signal in response to the deformation, the signal corresponding to a magnitude of the force exerted and configured to be multiplexed with an inactive state of both the touch sensor and the display.

2. The apparatus of claim 1, wherein the piezoelectric element array is configured to operate with the touch sensor to determine a location of the exerted force.

3. The apparatus of claim 1, wherein the piezoelectric element array comprises a group of distributed electrodes.

4. The apparatus of claim 1, wherein:
the display comprises a backlight and a polarizer; and
the piezoelectric element array is positioned between the backlight and the polarizer.

5. The apparatus of claim 1, wherein the piezoelectric element array is positioned on a back of the display.

6. The apparatus of claim 1, wherein at least one element of the piezoelectric element array generates a signal as it is stretched due to deformation of the input surface.

7. The apparatus of claim 1, wherein at least one element of the piezoelectric element array generates a signal as it is compressed due to deformation of the input surface.

8. The apparatus of claim 1, wherein the piezoelectric element array comprises a first electrode located on a first surface of a substrate and at a second electrode on a second surface of the substrate and aligned with the first electrode, wherein the second surface is opposite the first surface.

9. The apparatus of claim 1, wherein the piezoelectric element array comprises a group of electrodes located on a first surface of a substrate and at least one electrode on a second surface of the substrate, wherein the second surface is opposite the first surface.

10. The apparatus of claim 1, wherein the piezoelectric element array comprises a group of discrete piezoelectric structures, wherein each piezoelectric structure is associated with a corresponding set of electrodes.

11. The apparatus of claim 1, wherein the piezoelectric element array comprises a group of metal-oxide electrodes.

12. The apparatus of claim 11, wherein the group of metal-oxide electrodes is formed directly on the input surface.

13. The apparatus of claim 1, wherein the piezoelectric element array comprises:
a first piezoelectric structure comprising a first set of elongated electrodes extending longitudinally in a first direction;
a second piezoelectric structure comprising a second set of elongated electrodes extending longitudinally in a second direction; and
an electrode located between the first and second piezoelectric structures.

14. A touch device comprising:
an outer protective layer comprising a dielectric material;
a display positioned below the outer protective layer;
a piezoelectric structure below the display, wherein the piezoelectric structure comprises:
piezoelectric material, wherein the piezoelectric material is a dielectric material;
a first set of electrodes, comprising at least two electrodes, on a first surface of the piezoelectric material; and
a second set of electrodes, comprising at least two electrodes, on a second surface of the piezoelectric material and located between the piezoelectric material and the outer protective layer, the second set of electrodes configured to sense both an electrical charge generated by the piezoelectric material and a capacitance when a conductive material is brought into proximity with the outer protective layer.

15. The touch device of claim 14, wherein the device is configured to multiplex a capacitive sensing operation with a charge sensing operation.

16. The touch device of claim 14, wherein the piezoelectric material, first set of electrodes, and second set of electrodes comprise a film.

17. The touch device of claim 14, wherein the first and second set of electrodes are deposited on the piezoelectric material.

18. The touch device of claim 14, wherein the second set of electrodes are deposited on the outer protective layer.

19. The touch device of claim 14, wherein the second set of electrodes comprise a set of discretely addressed electrodes so that a location of both a force measurement and a capacitive measurement is discernable.

20. An apparatus comprising:
an input surface to receive an exerted downward force;

a touch sensor disposed below the input surface;
a display disposed below the touch sensor;
a piezoelectric element array disposed below and extending across the display, the piezoelectric element array configured to generate a signal corresponding to the exerted downward force and configured to be multiplexed with an inactive state of both the touch sensor and the display.

21. The apparatus of claim 20, wherein the piezoelectric element array is configured to determine a magnitude of the exerted downward force.

22. The apparatus of claim 20, wherein the piezoelectric element array is coupled to a backlight of the display.

23. The apparatus of claim 20, wherein the piezoelectric element array is positioned above a backlight of the display, and positioned below a polarizer of the display.

* * * * *